(12) United States Patent
Schmidt

(10) Patent No.: US 9,819,330 B2
(45) Date of Patent: Nov. 14, 2017

(54) FILTER FOR INTERPOLATED SIGNALS

(71) Applicant: Rohde & Schwarz GmbH & Co. KG, Munich (DE)

(72) Inventor: Stefan Schmidt, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 92 days.

(21) Appl. No.: 14/760,665

(22) PCT Filed: Jan. 15, 2014

(86) PCT No.: PCT/EP2014/050716
§ 371 (c)(1),
(2) Date: Jul. 13, 2015

(87) PCT Pub. No.: WO2014/114539
PCT Pub. Date: Jul. 31, 2014

(65) Prior Publication Data
US 2015/0357995 A1    Dec. 10, 2015

(30) Foreign Application Priority Data

Jan. 24, 2013  (DE) .................. 10 2013 201 126

(51) Int. Cl.
*G06F 7/38*    (2006.01)
*H03H 17/02*   (2006.01)
*H03H 17/06*   (2006.01)

(52) U.S. Cl.
CPC ...... *H03H 17/0225* (2013.01); *H03H 17/026* (2013.01); *H03H 17/0657* (2013.01)

(58) Field of Classification Search
None
See application file for complete search history.

(56) References Cited

U.S. PATENT DOCUMENTS 6,304,133 B1 * 10/2001 Sato .................. H03H 17/026
                                                  327/551
2012/0258676 A1   10/2012 Smart

FOREIGN PATENT DOCUMENTS

| EP | 0909027 A2   | 4/1999 |
| WO | WO0197376 A1 | 12/2001 |
| WO | WO2014114539 A1 | 7/2014 |

OTHER PUBLICATIONS

"Finer Audio From CDs", Machine Design, Penton Media, vol. 61, No. 17, Aug. 24, 1989, p. 64 and 66, Cleveland, OH, 2 pages.
Ghanekar S P et al, "Signed-Digit-Based Multiplier-Free Realizations for Multirate Converters", IEEE Transactions on Signal Processing, IEEE Service Center, New York, NY, vol. 43, No. 3, Mar. 1, 1995, pp. 628-639, II. Multiplier-Free Realizations, p. 630, right hand column—p. 633, right hand column, figures 4-6; III. Interpolators and Decimators, p. 634, left hand column—p. 635, left hand column.

(Continued)

*Primary Examiner* — Michael D Yaary
(74) *Attorney, Agent, or Firm* — Lee & Hayes, PLLC

(57) ABSTRACT

A digital filter for filtering an input signal to form an output signal containing a coefficient multiplier and a moving-average filter. The coefficient multiplier is embodied to multiply values of the input signal by coefficients of the filter to form an intermediate signal. The moving-average filter is embodied to generate the output signal as a moving average of the intermediate signal.

15 Claims, 6 Drawing Sheets

(56) References Cited

OTHER PUBLICATIONS

Hongyean Hsieh et al, "Spectral Shaping of Dithered Quantization Errors in Sigma-Delta Modulators", IEEE Transactions on Circuits and Systems Part 1: Regular Papers, IEEE Service Center, New York, NY, vol. 54, No. 5, May 1, 2007, pp. 974-980, III. Spectrally Shaped Noise Generator, p. 975, right hand column—p. 976, right hand column; figure 3.

Mark L. Riccio, John.C Belina, A Versatile Design Method of Fast, Linear-Phase FIR Filtering Systems for Electrocardiogram Acquisition and Analysis Systems, Proceedings of Computers in Cardiology 1992, 147-150.

Seymour Shlien et al, "Real-Time Generation of Narrow-Band Audio Noise", IEEE Signal Processing Letters, IEEE Service Center, Piscataway, NJ, vol. 3, No. 4, Apr. 1, 1996, III. Implementation, p. 110, right hand column—p. 111, left hand column; figure 1.

Steven W Smith Ed, Steven W Smith, "The Scientist and Engineer's Guide to Digital Signal Processing, Moving Average Filters", Scientist and Engineer's Guide to Digital Signal Processing, California Technical Publishing, San Diego, CA, pp. 277-284, Jan. 1, 1997, Retrieved from the Internet, <<http:///www.dspguide.com/>>, retrieved on Aug. 24, 2009, Implementation by Convolution, p. 277-p. 278, Recursive Implementation, p. 282-p. 284.

\* cited by examiner

FILTER FOR INTERPOLATED SIGNALS

TECHNICAL FIELD

The invention relates to a filter, a filter system, a noise generator, and a method for filtering.

BACKGROUND

In order to realize an FIR filter, a number of multipliers that approximately corresponds to the order of the filter is conventionally required. Such an FIR filter is shown, for example, in the published European patent application EP 0 909 027 A2. The disadvantage here is that the large number of multipliers represents a significant circuit effort.

SUMMARY

The invention is based upon the object of providing a filter, a filter system, a noise generator and a method which achieve a filtering with low effort.

This object is achieved according to the following description for the filter, the filter system, the noise generator, and for the method described herein. Advantageous further developments are discussed herein.

A digital filter according to the invention for filtering an input signal to form an output signal contains a coefficient multiplier and a moving-average filter. The coefficient multiplier is embodied to multiply values of the input signal by coefficients of the filter to form an intermediate signal. The moving-average filter is embodied to generate the output signal as a moving average of the intermediate signal. In this manner, the filter properties of an FIR filter can be achieved with low hardware effort.

By preference, the input signal corresponds to an output signal of a sample-and-hold element. Accordingly, the signal properties can be used in order to select a particularly simple realization.

The coefficient multiplier preferably contains precisely one multiplier, which multiplies every sampled value of the input signal by a coefficient. The coefficient multiplier then provides a multiplexer which, after every multiplication of the multiplier, selects a next coefficient for a subsequent multiplication. Accordingly, a particularly low hardware effort is required.

By preference, the coefficient multiplier contains a coefficient buffer which stores the coefficients of the filter. In this case, the coefficient multiplier contains a modulus counter, which implements a counting process after every multiplication of the multiplier. The modulus counter then controls the multiplexer in such a manner that the multiplexer supplies a given coefficient from the coefficient buffer to the multiplier with every value of the modulus counter. A particularly simple circuit construction is achieved in this manner.

In each case L successive sampled values in the input signal are preferably identical. The modulus counter is accordingly embodied in such a manner that the first value of the modulus counter is synchronized with the first of each of the L successive sampled values. In this manner, a correct coefficient sequence is reliably guaranteed.

By preference, the moving-average filter provides a first delay element for delaying the intermediate signal by L sampled values and a subtractor for subtracting the intermediate signal delayed by L sampled values from the intermediate signal to form a subtracted signal. The moving-average filter then provides a second delay element for delaying the subtracted signal by one sampled value, and an adder for adding the subtracted signal delayed by one sampled value and the subtracted signal to form the output signal. The moving-average filter can thus be realized with particularly few components.

Alternatively, the moving-average filter provides L-1 delay elements which are connected in series. The intermediate signal is then supplied to a first delay element of the series circuit of L-1 delay elements. In this case, the moving-average filter provides an adder for generating the output signal by adding the output signals of the L-1 delay elements and the intermediate signal. The function of the moving-average filter can be realized in this manner without recursive elements.

A filter system according to the invention contains at least one first and one second filter described above. Furthermore, it provides a delay element and an adder. An input signal of the filter system is accordingly supplied to the first filter as an input signal and to the delay element. In this context, the delay element is embodied to delay the input signal by L sampled values and supply it to the second filter as an input signal. The adder is accordingly embodied to add an output signal of the first filter and an output signal of the second filter to form an output signal of the filter system. The impulse response of the filter system thus corresponds to a filter of the order (2×L)−1. Accordingly, a high filter order can be achieved with the use of the low-effort filters.

By preference, the filter system provides Y filters described above, Y-1 delay elements and Y-1 adders. The Y-1 delay elements are then connected in series. The Y-1 adders are then also connected in series. The Y filters are each connected to an output, in each case of precisely one of the delay elements or to the input signal. The impulse response of the filter system thus corresponds to a filter of order (Y×L)−1. An arbitrary order of the filtering can be achieved in this manner.

A noise generator according to the invention provides at least one filter described above or one filter system described above. A noise generator can thus be realized in a particularly simple manner.

With a method according to the invention for filtering an input signal to form an output signal, values of the input signal are multiplied by coefficients to form an intermediate signal. The output signal is generated as a moving average of the intermediate signal. Accordingly, an FIR filtering can be realized at particularly low effort.

BRIEF DESCRIPTION OF THE DRAWINGS

In the following, the invention is described by way of example on the basis of the drawings in which advantageous exemplary embodiments of the invention are shown. The figures depict as follows.

DETAILED DESCRIPTION

Initially, the properties of the underlying input signal will be described with reference to Fig. 1*a*-Fig. 1*c*. Following this, different exemplary embodiments of the filter according to the invention will be described with reference to FIG. 2-Fig. 4*b*. With reference to FIG. 5, an exemplary embodiment of the filter system according to the invention will then be explained in greater detail. Different exemplary applications of the filter according to the invention will be visualized on the basis of FIG. 6 and FIG. 7. Finally, the functioning of an exemplary embodiment of the method according to the invention will be described with reference to FIG. 8. The presentation and description of identical elements in similar drawings have not been repeated in some cases.

The invention is based upon the exploitation of the special properties of an output signal of a 0th order interpolator to simplify the construction of a filter for filtering this signal. A 0th order interpolator is a simple holding element. The input value of every input clock period $T_{in}=1/f_{in}$ is held at the output for L output clock periods $T_{out}=1/f_{out}$. In this context, L designates the interpolation factor, and the following applies:

$$f_{out}=L*f_{in}$$

In system-theoretical terms, the non-recursive part of a time-discrete filter can be described by its impulse response $h_{FIR}(n)$:

$$h_{FIR}(n) = \begin{cases} b_n & n = 0, 1, \ldots, M-1 \\ 0 & \text{otherwise} \end{cases}$$

The output signal of the filter y(n) is obtained as the convolution of the input signal x(n) with the impulse response $h_{FIR}(n)$:

$$y(n) = x(n) \otimes h_{FIR}(n) = \sum_{k=0}^{M-1} x(n-k) h_{FIR}(k) = \sum_{k=0}^{M-1} x(n-k) b_k \quad \text{Equation 1}$$

Different forms are known for the realization of equation 1, for example, the direct normal form, the cascaded form, the poly-phase form, and the lattice structure. If the sampling rate of the input sequence corresponds to the available system clock, M multipliers are generally required in all of the above named structures.

However, if the system clock is higher than the sampling rate, M multipliers are required only if the following applies:

Sampling rate>$((M-1)/M)$*system clock.

Figure 1A:
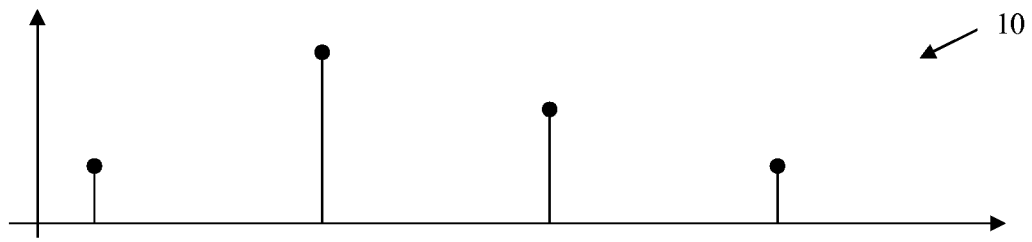
FIG. 1a illustrates a first exemplary signal according to the application.

The input signal x(n) of the 0th order interpolator is presented in FIG. 1*a* as the signal 10.

The signal to be filtered $x_{interpol}(n)$, which corresponds to the output signal of the 0th order interpolator, has the following structure:

$$x_{interpol} = \begin{cases} \ldots \underbrace{x(k), x(k), \ldots, x(k)}_{L}, \underbrace{x(k+1), x(k+1), \ldots, x(k+1)}_{L}, \ldots, \\ \underbrace{x(k+N), x(k+N), \ldots, x(k+N)}_{L} \ldots \end{cases}$$

Figure 1B:
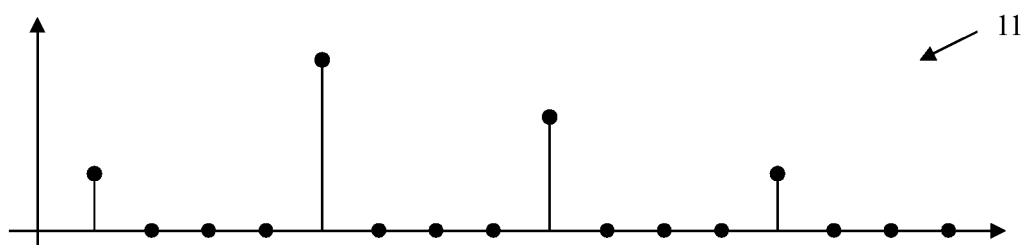
FIG. 1b illustrates a second exemplary signal according to the application.
Figure 1C:
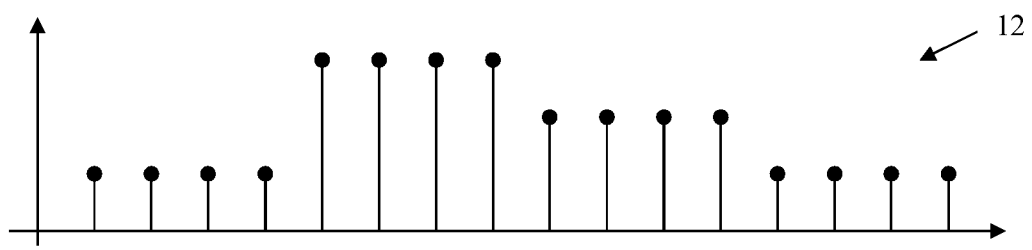
FIG. 1c illustrates a third exemplary signal according to the application.

The signal $x_{interpol}(n)$ is illustrated in FIG. 1*c* as signal 12. To obtain a mathematical description $x_{interpol}(n)$, we use the auxiliary signal $x_e$ $$x_e = \begin{cases} \ldots \underbrace{x(k), 0, 0, \ldots, 0}_{L}, \underbrace{x(k+1), 0, 0, \ldots, 0}_{L}, \ldots, \\ \underbrace{x(k+N), 0, 0, \ldots, 0}_{L} \ldots \end{cases},$$

which is illustrated in FIG. 1*b* as signal 11. A mathematical formulation $x_e(n)$ for our auxiliary signal is given by:

$$x_e(n) = \sum_{k=-\infty}^{\infty} x(k)\delta(n-kL),$$

where the delta function $\delta(n)$ is defined as $$\delta(n) = \begin{cases} 1 & n = 0 \\ 0 & n \neq 0 \end{cases}.$$

If $x_e(n)$ is now filtered with $h_{interpol}(n)$, where $$h_{interpol}(n) = \begin{cases} 1 & 0 \leq n \leq L-1 \\ 0 & \text{otherwise} \end{cases},$$

the following is finally obtained:

$$x_{interpol}(n) = x_e(n) \otimes h_{interpol}(n) =$$

$$\sum_{l=0}^{L-1} x_e(n-1) h_{interpol}(l) = \sum_{l=0}^{L-1} x_e(n-1) = \sum_{l=0}^{L-1} \sum_{k=-\infty}^{\infty} x(k)\delta(n-1-kL)$$

The filtering of $x_{interpol}(n)$ with $h_{FIR}(n)$ $$h_{FIR}(n) = \begin{cases} b_n & 0 \leq n \leq L-1 \\ 0 & \text{otherwise} \end{cases}$$

leads to:

$$y(n) = \sum_{r=0}^{L-1} x_{interpol}(n-r) h_{FIR}(r)$$

$$= \sum_{r=0}^{L-1} \sum_{l=0}^{L-1} \sum_{k=-\infty}^{\infty} x(k)\delta(n-r-1-kL) h_{FIR}(r)$$

-continued $$\stackrel{(*)}{=} \sum_{r=0}^{L-1} \sum_{l=0}^{L-1} \sum_{k=-\infty}^{\infty} x(k)\delta(n-r-1-kL)h_{FIR}(l)$$

The identity (*) applies for reasons of symmetry.
The following applies:

$$\delta(n-r-1-kL)h_{FIR}(l) = \begin{cases} h_{FIR}(l) & n = r+1+kL \\ 0 & \text{otherwise} \end{cases}.$$

If we now consider the expression:

$$\delta(n-r-1-kL) \sum_{m=-\infty}^{\infty} h_{FIR}(n-r-mL),$$

this is equal to 0 for all n≠r+1+kL. For n=r+1+kL, we obtain:

$$\delta(0) \sum_{m=-\infty}^{\infty} (r+1+kL-r-mL) = \sum_{m=-\infty}^{\infty} h_{FIR}(1+(k-m)L) \stackrel{(*)}{=} h_{FIR}(l)$$

The identity (*) applies, since $0 \leq l \leq L-1$ and $h_{FIR}(l')=0$ if $l' \geq L$ or $l' < 0$.
Overall, therefore, the following applies:

$$\delta(n-r-1-kL) \sum_{m=-\infty}^{\infty} h_{FIR}(n-r-mL) = \begin{cases} h_{FIR}(l) & n = r+1+kL \\ 0 & \text{otherwise} \end{cases}.$$

Accordingly, we have shown that:

$$\delta(n-r-1-kL)h_{FIR}(l) = \delta(n-r-1-kL) \sum_{m=-\infty}^{\infty} h_{FIR}(n-r-mL).$$

From this, the following is now obtained:

$$y(n) = \sum_{r=0}^{L-1} \sum_{l=0}^{L-1} \sum_{k=-\infty}^{\infty} \sum_{m=-\infty}^{\infty} x(k)\delta(n-1-kL)h_{FIR}(n-r-mL).$$

If we now define:

$$b(n) = \sum_{l=0}^{L-1} \sum_{k=-\infty}^{\infty} \sum_{m=-\infty}^{\infty} x(k)\delta(n-1-kL)h_{FIR}(n-mL),$$

the following applies:

$$y(n) = \sum_{r=0}^{L-1} b(n-r). \quad \text{Equation 2}$$

Furthermore, if we define:

$$h'_{FIR}(n) = \sum_{m=-\infty}^{\infty} h_{FIR}(n-mL) = h_{FIR}((n)_L), \quad \text{Equation 3}$$

Where $(n)_L$ designates the modulus L operator, we finally obtain:

$b(n) = x_{interpol}(n) * h'_{FIR}(n)$.

A filter structure can now be derived from equation 2 -equation 4.

Figure 3:
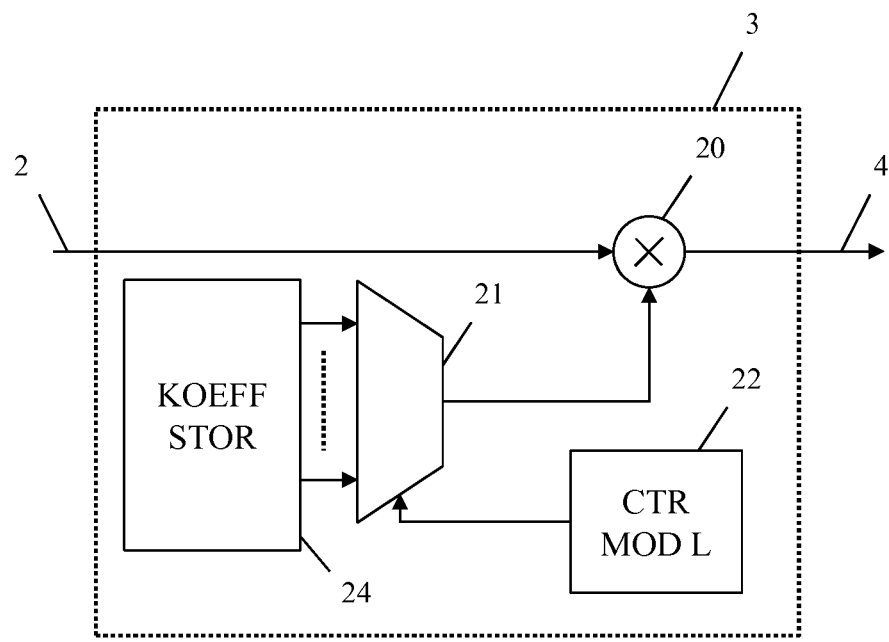
FIGS. 3 and 4a illustrate a detailed view of the first exemplary embodiment of the filter according to the application.

According to equation 4, b(n) is generated by the circuit from FIG. 3. Equation 2 describes a moving-average filter and can be realized alternatively by the circuits in FIG. 4a or FIG. 4b. Finally, the overall filter structure is obtained from a combination of the circuits from FIG. 3 and FIG. 4a or FIG. 3 and FIG. 4b.

Instead of L multipliers for an order L-1 filter, as is conventional, only a single multiplier is required.

Figure 2:
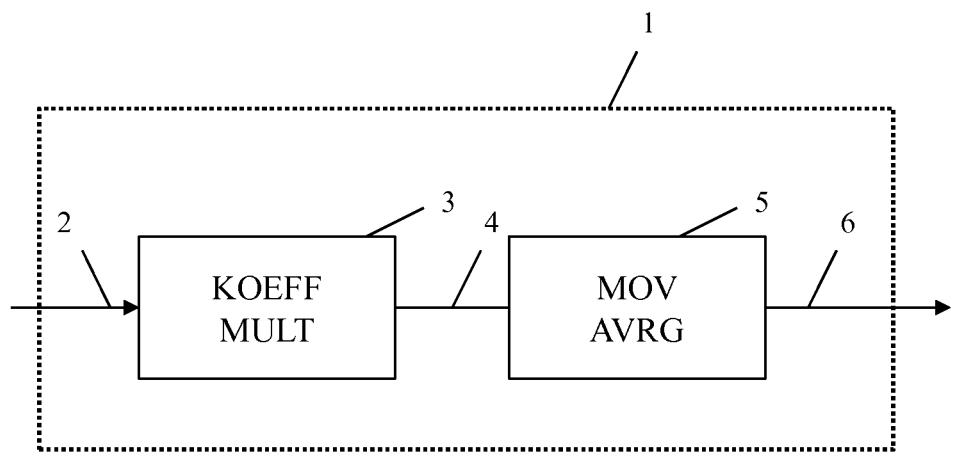
FIG. 2 illustrates a first exemplary embodiment of the filter according to the application in a block-circuit diagram.

FIG. 2 shows a first exemplary embodiment of the filter 1 according to the invention in a block-circuit diagram. The filter 1 contains a coefficient multiplier 3, which is connected to a moving-average filter 5. An input signal 2, which corresponds, for example, to the signal 12 from FIG. 1c, is supplied to the coefficient multiplier 3 and multiplied by filter coefficients by the latter. In this context, each sampled value of the input signal 2 is multiplied by precisely one filter coefficient. The sequence of sampled values of the input signal 2 multiplied by the filter coefficients is output from the coefficient multiplier 3 as an intermediate signal 4.

In this context, the coefficient multiplier 3 accesses L coefficients. After every multiplication of a sampled value of the input signal 2 by one of the L coefficients, a next one of the L coefficients is used for the next multiplication. As soon as the last of the L coefficients has been used, the process switches back to the first coefficient again. The function of the coefficient multiplier 3 will be described in greater detail with reference to FIG. 3.

The intermediate signal 4 is supplied to the moving-average filter 5, which forms a moving average of the intermediate signal 4 and outputs it as an output signal 6. In this context, the moving-average filter 5 forms the moving average of a window length which corresponds to the number of filter coefficients L. Accordingly, a moving average of L sampled values of the intermediate signal 4 is formed by the moving-average filter 5 and output as the output signal 6.

FIG. 3 shows a detailed view of the first exemplary embodiment of the filter 1. Here, in particular, the coefficient multiplier 3 is shown in detail. The coefficient multiplier 3 comprises a multiplier 20, a coefficient buffer 24, a multiplexer 21, and a modulus counter 22. The input signal 2 is supplied to the multiplier 20 at a first input. An output signal of the multiplexer 21 is supplied to the multiplier 20 at a second input. The multiplexer 21 is further connected to the coefficient buffer 24. Furthermore, the multiplexer 21 is connected to the modulus counter 22.

The modulus counter 22 performs a counting process after every multiplication of the multiplier 20, that is, after every sampled value of the input signal 2. In this context, the modulus counter 22 counts from 0 to L-1. The output signal of the modulus counter 22 is supplied to the multiplexer 21 as a control signal. Through the output signal of the modulus counter 22, a coefficient buffered in the coefficient buffer 24 is selected by the multiplexer 21 and supplied to the multiplier 20.

Accordingly, L coefficients are stored in the coefficient buffer 24. These L coefficients are supplied to the multiplier 20 in succession in a rigidly specified sequence. The sampled values of the input signal 2 are thus multiplied in succession by the L coefficients stored in the coefficient buffer 24.

As already explained, identical values are repeated in the input signal 2, in each case L times in direct succession. This is a direct consequence of the property that the input signal 2 corresponds to an output signal of a 0th order interpolator. In this context, the first occurrence of a new value of the input signal 2 is synchronized with a first one of the L coefficients which is stored in the coefficient buffer 24. This ensures that the L identical values of the input signal 2 following in succession are multiplied by all the filter coefficients in the correct sequence. The sequence of values of the input signal 2 multiplied by the filter coefficients is outputted from the coefficient multiplier 3 as the intermediate signal 4.

Accordingly, the coefficient multiplier 3 contains only the precisely one multiplier 20. However, in this context, the multiplier 20 is a logical multiplier. In one realization, for example, several multipliers can be connected together to form this multiplier, for example, on an FPGA, if the bit width of one single multiplier is not sufficient. Also, in the case of a complex signal, which contains an I-component and a Q-component, 4 physical multipliers, which perform the logical multiplication of the signals, are used in a real circuit instead of the precisely one logical multiplier 20. Accordingly, in a real circuit implementation, several multipliers, which, however, always process at least parts of one sampled value of the input signal at the same time, can correspond to the logical multiplier 20.

Figure 4A:
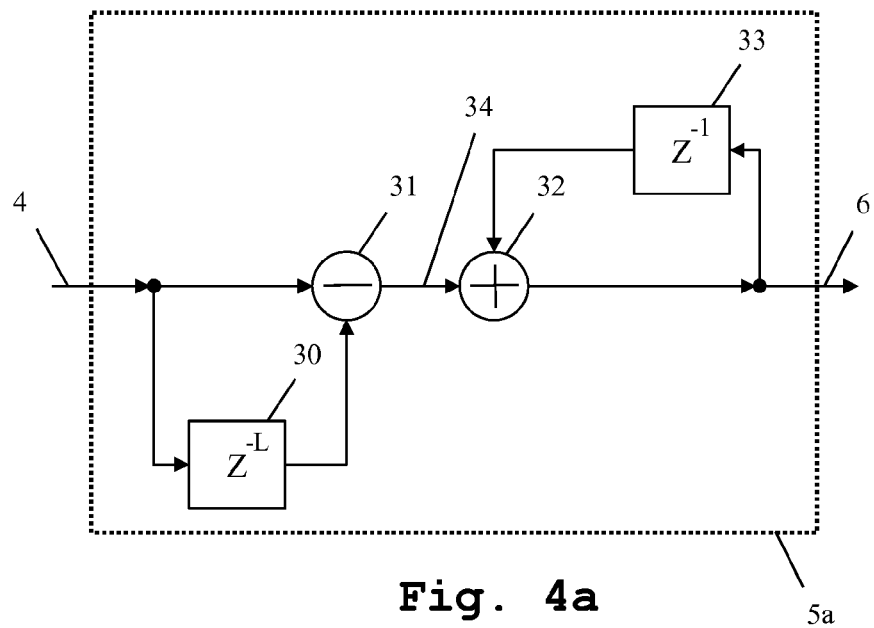
Figure 5:
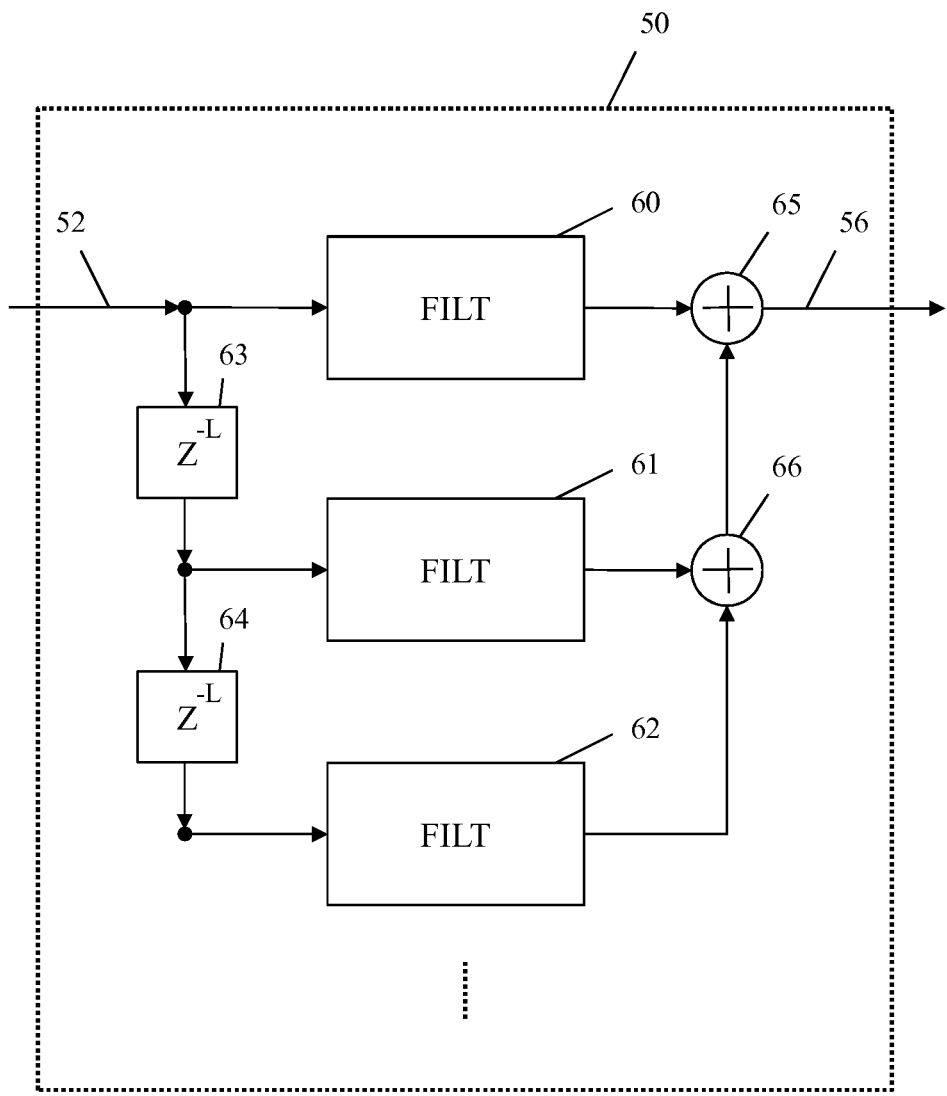
FIG. 5 illustrates an exemplary embodiment of the filter system according to the application.

FIG. 4a shows a detailed view of the moving-average filter 5 from FIG. 2. Since a first alternative is presented here, the moving-average filter 5 is designated with the reference number 5a in this context. The moving-average filter 5a comprises a subtractor 31 which is connected at its first input to the intermediate signal 4. Furthermore, the moving-average filter 5a comprises a first delay element 30, which is also connected at its input to the intermediate signal 4. At its output, the first delay element 30 is connected to a second input of the subtractor 31. The subtractor 31 is connected at the output-end to a first input of an adder 32. The moving-average filter 5a further comprises a second delay element 33, which is connected at the input-end to an output of the adder 32. At the output-end, the second delay element 33 is connected to a second input of the adder 32.

The intermediate signal 4 is supplied to the subtractor 31 at its first input. Furthermore, the intermediate signal 4 is supplied to the first delay element 30. The delay element 30 delays the intermediate signal 4 by L sampled values and supplies the intermediate signal 4 delayed by L sampled values to the second input of the subtractor 31. The subtractor 31 subtracts the intermediate signal 4 delayed by L sampled values from the intermediate signal 4. At the output of the subtractor 31, a subtracted signal 34 is generated. This is supplied to the adder 32. Furthermore, an output signal of the adder 32 delayed by one sampled value is supplied to the adder 32 via the second delay element 33. The output signal of the adder 32 corresponds to the output signal 6 of the filter.

The embodiment of the moving-average filter presented above allows a very simple realization of a moving-average filter of window length L using a few components.

Figure 4B:
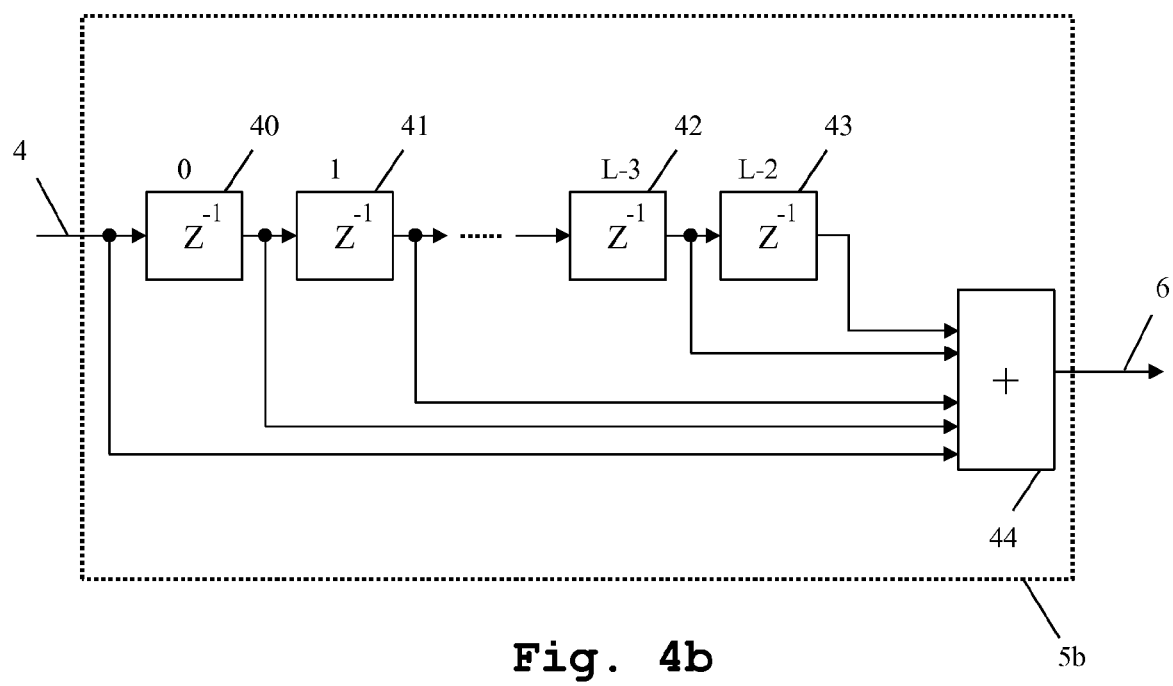
FIG. 4b illustrates a detailed view of a second exemplary embodiment of the filter according to the application.

As an alternative, a further embodiment of a moving-average filter is presented in FIG. 4b. The moving-average filter 5b contains a plurality of delay elements 40-43 which are connected in series. In this context, the intermediate signal 4 is supplied to the first delay element 40. The output signal of the first delay element 40 is supplied as an input signal to the second delay element 41. The output signals of the individual delay elements and the intermediate signal 4 are combined via an adder 44 to form the output signal of the filter 6.

FIG. 5 shows an exemplary embodiment of a filter system according to the invention. The filter according to the invention provides the disadvantage that a maximal filter order of the filter of only L-1 can be achieved. That is, with an L-fold repetition of every value of the input signal, as presented in FIG. 1c, a maximal L-1th order of the filter can be achieved.

In this context, the filter system shown here provides some assistance. The filter system 50 according to the invention comprises filters 60-62 according to the invention. A first filter 60 according to the invention is connected at the input end to an input signal 52 and at the output end to an adder 65. The input signal 52 is further supplied to a delay element 63, which implements a delay by L sampled values. The delay element 63 is connected at the output end to the input of a second filter 61 according to the invention. At the output end, this second filter 61 is connected to a second adder 66. The output signal of the delay element 63 is further connected to a second delay element 64, which again implements a delay by L sampled values. The output signal of this second delay element is connected to the input of the third filter 62 according to the invention. The third filter 62 according to the invention is again connected at the output end to the second adder 66. The adders 65, 66 add the output signals of the filters 60-62 according to the invention to form the output signal 56.

In this context, the filter system 50 is not restricted to precisely three filters according to the invention. A realization with only two filters 60, 61 according to the invention is also possible. Conversely, a realization with an arbitrary number of filters according to the invention is possible. The input signals of the individual filters in this context are each delayed by a further L sampled periods by comparison with the preceding filter. The output signals of the individual filters are then added by means of adders to form the output signal 56.

With the filter system 50 according to the invention, an arbitrary order of the overall filter realized can be achieved. If Y is the number of the individual filters according to the invention, an order of the impulse response of the filter system of $(Y \times L)-1$ can thus be achieved.

Figure 6:
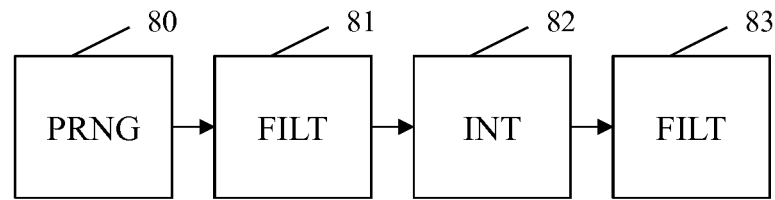
FIG. 6 illustrates an exemplary embodiment of the noise generator according to the application.

FIG. 6 shows an exemplary embodiment of the noise generator according to the invention. A random-number generator 80 is connected to a first filter 81. The first filter 81 is connected to a 0th order interpolator 82. The 0th order interpolator 82 is connected to a filter 83 according to the invention.

The random-number generator 80 generates random numbers which are filtered by the optional first filter 81. In this context, the sampling frequency of the random-number generator 80 corresponds to the sampling frequency of the first filter 81. The 0th order interpolator ensures a band limitation of the resulting signal. A sampling frequency of L times the sampling frequency of the random-number generator is accordingly present at the output of the 0th order interpolator 82. As described with reference to FIG. 1c, L sampled values are repeated here in each case.

The output signal of this 0th order interpolator 82 is supplied to a filter 83 according to the invention which performs an FIR filtering. Such a filter could serve for the spectral formation of the noise, for example, by increasing the stop-band attenuation.

Figure 7:
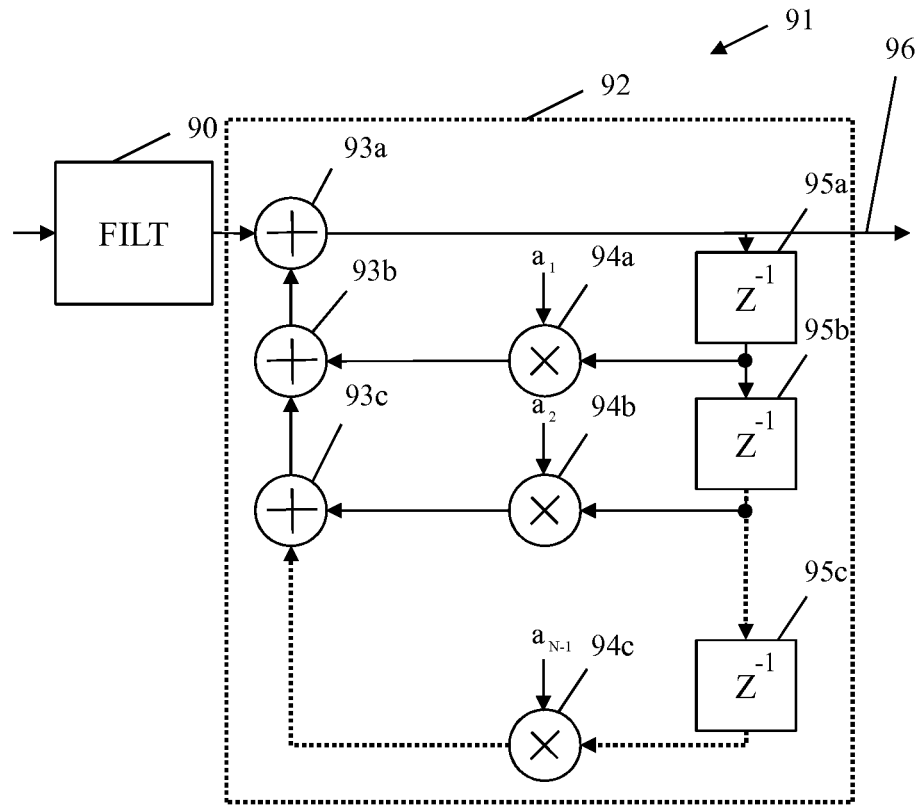
FIG. 7 illustrates a use of a third exemplary embodiment of the filter according to the application in an IIR filter.

A further application of the filter according to the invention is shown in FIG. 7. The use of the filter 90 according to the invention is shown here in an IIR filter 91. An IIR filter 91 is made up from an FIR filter, which is realized here by the filter 90 according to the invention, and a recursive filter part 92. This recursive filter part 92 contains a plurality of adders 93a-93c and a plurality of multipliers 94a-94c. Furthermore, the recursive filter part 92 contains a plurality of delay elements 95a-95c. The output signal of the filter 90 according to the invention is supplied to a first adder 93a. The output signal of this adder 93a is supplied to a delay element 95a. The delay element 95a delays the resulting signal by one sampled value and transmits the resulting signal to a multiplier 94a, which multiplies it by a first coefficient a1. The resulting signal from the multiplier 94a is supplied to an adder 93b.

Furthermore, the output signal of the delay element 95a is supplied to a further delay element 95b which also performs a delay by one sampled value. The output signal of this delay element 95b is supplied in turn to a multiplier 94b which performs a multiplication by a coefficient a2. The output signal of this multiplier 94b is supplied to an adder 93c. The recursive filter part 92 can contain an arbitrary number of these individual stages just presented. Here, only one further stage comprising a delay element 95c and a multiplier 94c is presented. The output signals of the multipliers 94a-94c are each supplied to the adders 93a-93c and added by the latter to form the output signal 96. Accordingly, an IIR filter can be realized with low hardware effort.

Figure 8:
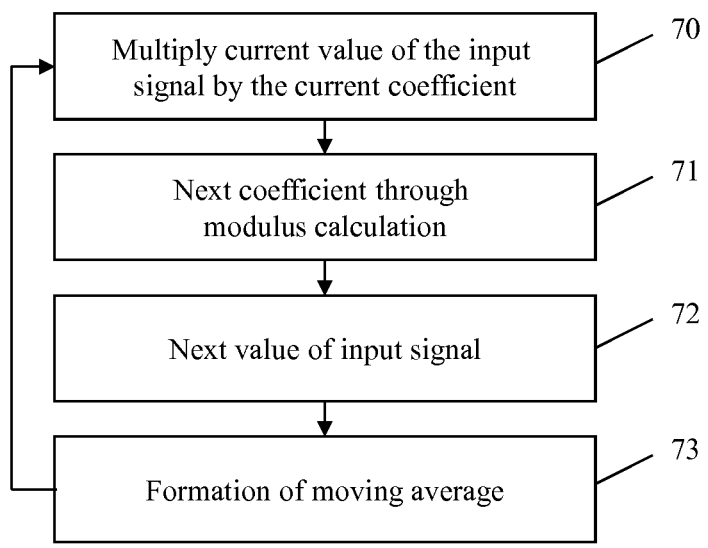
FIG. 8 illustrates a flow diagram of an exemplary embodiment of the method according to the application.

Finally, FIG. 8 presents an exemplary embodiment of the method according to the invention. In a first step 70, a current value of an input signal which corresponds to the output signal of a 0th order interpolator is multiplied by a current coefficient. In a second step 71, a next coefficient is determined by modulus calculation. In a third step 72, a next value of the input signal is selected. In this context, the values of the input signal are each repeated L times, as described with reference to FIG. 1c. Similarly, L different coefficients are used. In a fourth step 73, a moving average of the current value and L-1 previous values is formed. The moving average corresponds to the present output signal. Steps 70-73 are repeated constantly. As soon as the last coefficient has been reached, the first coefficient is selected again on the basis of the modulus calculation.

The invention is not restricted to the exemplary embodiment presented. As already mentioned, different moving-average filters can be used. A use of the filter according to the invention in a plurality of different devices is also possible. For example, a use in the post-processing of a resolution enhancement of image signals is possible. In particular, in this context, the input signal need not have been generated by a sample-and-hold element. The exemplary embodiment of the coefficient multiplier shown in FIG. 3 is therefore not a compulsory embodiment. Other designs are also conceivable. In particular, the coefficient buffer and the multiplexer can be replaced by a buffer module addressed by the modulus counter. All of the features described above or the features shown in the drawings can be combined with one another arbitrarily in an advantageous manner within the scope of the invention.

The invention claimed is:

1. A digital filter for filtering an input signal to form an output signal, comprising:
    a coefficient multiplier embodied to multiply values of the input signal by coefficients of the filter to form an intermediate signal; and
    a moving-average filter embodied to generate the output signal as a moving average of the intermediate signal, wherein the moving-average filter includes:
        a first delay element for delaying the intermediate signal by L sampled values,
        a subtractor for subtracting the intermediate signal delayed by L sampled values from the intermediate signal to form a subtracted signal,
        a second delay element for delaying the subtracted signal by one sampled value, and
        an adder for adding the subtracted signal delayed by one sampled value and the subtracted signal to form the output signal.

2. The digital filter according to claim 1, wherein the input signal corresponds to an output signal of a sample-and-hold element.

3. The digital filter according to claim 1, wherein the digital filter provides L coefficients and an order of L-1.

4. The digital filter according to claim 1, wherein the coefficient multiplier comprises:
    a logical multiplier that multiplies every sampled value of the input signal by a coefficient; and
    a multiplexer that selects a next coefficient for a subsequent multiplication after the multiplication of the logical multiplier.

5. The digital filter according to claim 4, wherein:
    the coefficient multiplier contains a coefficient buffer that stores the coefficients of the digital filter;
    the coefficient multiplier contains a modulus counter that implements a counting process after every multiplication of the multiplier; and
    the modulus counter controls the multiplexer to supply a coefficient from the coefficient buffer to the multiplier with every value of the modulus counter.

6. The digital filter according to claim 1, wherein:
    L successive sampled values within the input signal are identical in each case; and
    the modulus counter is embodied where a first value of the modulus counter is synchronized with the first of the respective L successive sampled values.

7. A digital filter for filtering an input signal to form an output signal, comprising:
    a coefficient multiplier embodied to multiply values of the input signal by coefficients of the filter to form an intermediate signal; and
    a moving-average filter embodied to generate the output signal as a moving average of the intermediate signal, wherein:
        the moving-average filter provides L-1 delay elements connected in series;
        the intermediate signal is supplied to the first delay element of the L-1 delay element series; and
        the moving-average filter provides an adder for generating the output signal through addition of the output signals of the L-1 delay elements and the intermediate signal.

8. The digital filter according to claim 1, wherein the digital filter is an FIR filter.

9. A filter system, comprising:
    a digital filter according to claim 1, which is a first filter;
    a second filter, which is a digital filter according to claim 1;
    a delay element; and
    an adder;

wherein an input signal of the filter system is supplied to the first filter as an input signal and to the delay element;

wherein the delay element is embodied to delay the input signal by L sampled values and to supply it to the second filter as an input signal; and wherein the adder is embodied to add an output signal of the first filter and an output signal of the second filter to form an output signal of the filter system.

10. The filter system according to claim 9, wherein an impulse response of the filter system corresponds to a filter of the order (2×L)−1.

11. A filter system, comprising:
Y filters according to claim 1;
Y-1 delay elements; and
and Y-1 adders;
wherein the Y-1 delay elements are connected in series;
wherein the Y1 adders are connected in series;
wherein the Y filters are each connected to the output in each case of precisely one of the delay elements or the input signal; and
wherein the impulse response of the filter system corresponds to a filter of the order (Y×L)-1.

12. A digital filter according to claim 1, further comprising a noise generator.

13. A filter system according to claim 9, further comprising a noise generator.

14. A filter system, comprising:
a digital filter according to claim 7, which is a first filter;
a second filter, which is a digital filter according to claim 7;
a delay element; and
an adder;
wherein an input signal of the filter system is supplied to the first filter as an input signal and to the delay element;
wherein the delay element is embodied to delay the input signal by L sampled values and to supply it to the second filter as an input signal; and
wherein the adder is embodied to add an output signal of the first filter and an output signal of the second filter to form an output signal of the filter system.

15. A filter system, comprising:
Y filters according to claim 7;
Y-1 delay elements; and
and Y-1 adders;
wherein the Y-1 delay elements are connected in series;
wherein the Y-1 adders are connected in series;
wherein the Y filters are each connected to the output in each case of precisely one of the delay elements or the input signal; and
wherein the impulse response of the filter system corresponds to a filter of the order (Y×L)−1.

* * * * *